(12) United States Patent
Jo et al.

(10) Patent No.: US 8,088,648 B2
(45) Date of Patent: Jan. 3, 2012

(54) METHOD OF MANUFACTURING A CHIP STACK PACKAGE

(75) Inventors: Cha-Jea Jo, Suwon-si (KR);
Myung-Kee Chung, Cheonan-si (KR);
Nam-Seog Kim, Yongin-si (KR);
In-Young Lee, Yongin-si (KR); Seok-Ho Kim, Bucheon-si (KR); Ho-Jin Lee, Seoul (KR); Ju-Il Choi, Suwon-si (KR);
Chang-Woo Shin, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/840,656

(22) Filed: Jul. 21, 2010

(65) Prior Publication Data

US 2010/0285635 A1    Nov. 11, 2010

Related U.S. Application Data

(62) Division of application No. 12/051,619, filed on Mar. 19, 2008, now abandoned.

(30) Foreign Application Priority Data

Mar. 19, 2007    (KR) .................. 10-2007-0026409

(51) Int. Cl.
*H01L 21/50* (2006.01)
*H01L 21/60* (2006.01)
(52) U.S. Cl. ............... 438/109; 257/777; 257/E21.499
(58) Field of Classification Search ........... 257/736, 257/777, E21.499, E21.506; 438/109
See application file for complete search history.

(56) References Cited

U.S. PATENT DOCUMENTS 6,534,874 B1    3/2003    Matsumura
(Continued)

FOREIGN PATENT DOCUMENTS

JP    2001-127240    5/2001
(Continued)

OTHER PUBLICATIONS

"Chip Stack Package and Method of Manufacturing the Chip Stack Package" Specification, Drawings, and Prosecution History, of U.S. Appl. No. 12/051,619, filed Mar. 19, 2008, by Cha-Jea Jo, et al., which is stored in the United States Patent and Trademark Office (USPTO) Image File Wrapper (IFW) system.

*Primary Examiner* — Ha Tran T Nguyen
*Assistant Examiner* — Raj R Gupta
(74) *Attorney, Agent, or Firm* — Onello & Mello, LLP

(57) ABSTRACT

A chip stack package includes a substrate, a plurality of chips, a plurality of adhesive layers and a plug. The substrate has a wiring pattern and a seed layer formed on the wiring pattern. Each of the chips has an electrode pad and a first through-hole that penetrates the electrode pad. The chips are stacked such that the first through-holes are aligned on the seed layer of the substrate. The adhesive layers are interposed between the substrate and one of the chips, as well as between the chips. Each of the adhesive layers has a second through-hole connected to the first through-hole. The plug fills up the first through-holes and the second through-holes and electrically connects the electrode pads to the wiring pattern of the substrate. A cross-sectional area of the plug in the second through-holes may be larger than that of the plug in the first through-holes.

15 Claims, 12 Drawing Sheets

U.S. PATENT DOCUMENTS

| | | |
|---|---|---|
| 6,566,232 B1 | 5/2003 | Hara et al. |
| 6,916,725 B2 * | 7/2005 | Yamaguchi ............ 438/459 |
| 7,276,799 B2 | 10/2007 | Lee et al. |
| 7,399,120 B2 | 7/2008 | Yamada |
| 7,537,959 B2 | 5/2009 | Lee et al. |
| 2005/0046002 A1 | 3/2005 | Lee et al. |
| 2005/0253274 A1 | 11/2005 | Hikita et al. |
| 2006/0073637 A1 * | 4/2006 | Yokoyama et al. ........ 438/109 |
| 2006/0153478 A1 | 7/2006 | Yamada |
| 2007/0281374 A1 | 12/2007 | Lee et al. |
| 2008/0230923 A1 | 9/2008 | Jo et al. |
| 2009/0174070 A1 * | 7/2009 | Ramanathan et al. ........ 257/737 |
| 2009/0209063 A1 | 8/2009 | Lee et al. |

FOREIGN PATENT DOCUMENTS

| | | |
|---|---|---|
| JP | 2001-135776 | 5/2001 |
| KR | 10-2005-0021078 | 3/2005 |
| KR | 10-2006-0074806 | 7/2006 |

* cited by examiner

METHOD OF MANUFACTURING A CHIP STACK PACKAGE

CROSS-REFERENCE TO RELATED APPLICATIONS

This application is a divisional application of U.S. patent application Ser. No. 12/051,619, filed on Mar. 19, 2008, which claims the benefit of Korean patent application number 10-2007-0026409, filed on Mar. 19, 2007, in the Korean Intellectual Property Office, the contents of which applications are incorporated herein in their entirety by reference.

BACKGROUND

1. Technical Field

Example embodiments of the present invention relate to a chip stack package and a method of manufacturing the chip stack package. More particularly, example embodiments of the present invention relate to a chip stack package including a plurality of chips stacked on a wiring substrate and a method of manufacturing the chip stack package.

2. Description of the Related Art

Generally, semiconductor devices are manufactured by a fabrication process, an electrical die sorting (EDS) process, and a packaging process. The fabrication process typically comprises forming electric circuits including electric elements on a semiconductor substrate such as a silicon wafer. The electrical die sorting (EDS) process includes inspecting electrical properties of chips formed by the fabrication process. The packaging process includes sealing the chips with resin such as epoxy and sorting the chips.

Nowadays, a chip stack package is used as one type of packaging technology to increase the packaging efficiency of the chips per unit volume. To manufacture the chip stack package, recesses are formed at upper surface portions of the chips, respectively. Then, each of the recesses is filled up with a conductive material by a plating process to form a plug in the recesses. After a solder is coated on the plug, a lower surface of each of the chips is planarized until the plug is exposed. The chips including the plugs are stacked on a silicon substrate or a printed circuit board (PCB). The chips are bonded to form the chip stack package.

However, because the plug is formed in each of the chips in order to manufacture the chip stack package, a time required to perform the plating process for forming the plugs in the chips may be greatly increased. Additionally, a void may be generated within the plug. Further, uniformity of the shape and dimensions of the plug may be deteriorated. The chips may not be aligned accurately when the chips are stacked on the silicon substrate or the PCB because the solder coated on the plug protrudes from the upper surface of the chip. Thus, not only a contact problem between the solder of one chip and the plug of an adjacent chip but also tilting of the multi-stacked chips may occur.

Further, when the chips have different sizes and the plugs are spaced apart from one another, it may be difficult to manufacture the chip stack package. The present invention addresses these and other disadvantages of conventional methods.

SUMMARY

Example embodiments of the present invention provide a chip stack package in which the generation of a void within a plug is minimized and in which chips are easily stacked. Example embodiments of the present invention also provide a method of manufacturing the chip stack package.

According to one aspect of the present invention, a chip stack package includes a substrate, a plurality of chips, a plurality of adhesive layers and a plug. The substrate has a wiring pattern and a seed layer formed on the wiring pattern. Each of the chips has an electrode pad and a first through-hole that penetrates the electrode pad. The chips are stacked such that the first through-holes are aligned on the seed layer of the substrate. The plurality of adhesive layers is interposed between the substrate and one of the chips, as well as between the chips. Each of the adhesive layers has a second through-hole connected to the first through-hole. The plug fills up the first through-holes and the second through-holes and electrically connects the electrode pads of the chips to the wiring pattern of the substrate.

BRIEF DESCRIPTION OF THE DRAWINGS

The above and other features and advantages of the present invention will become more apparent by describing in detailed example embodiments thereof with reference to the accompanying drawings, in which.

DETAILED DESCRIPTION

Figure 1:
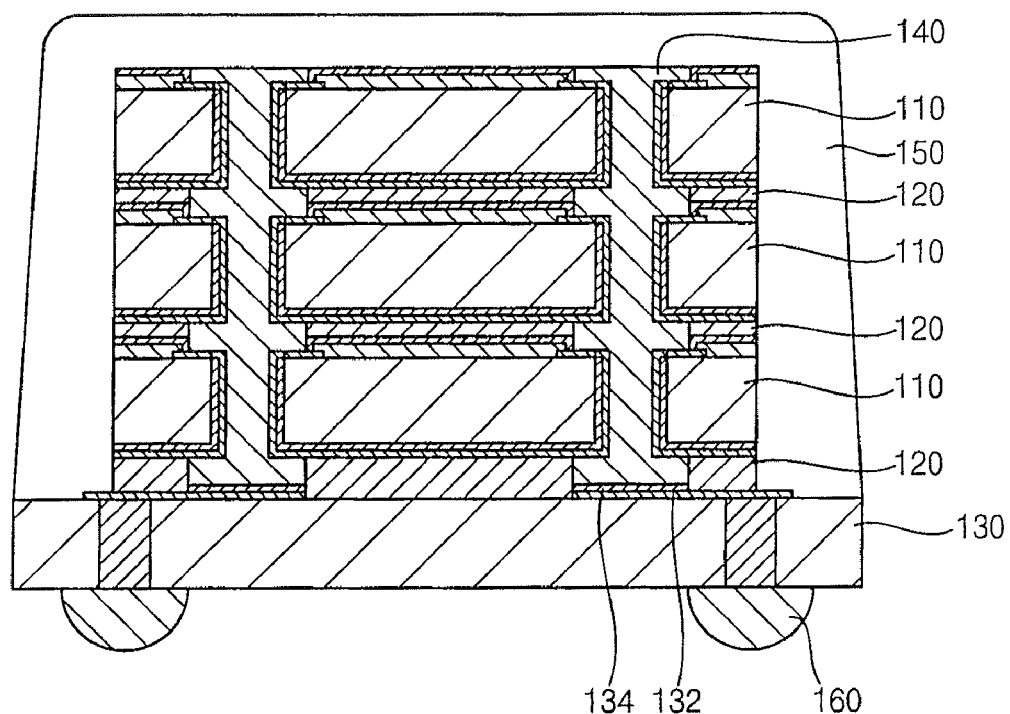
FIG. 1 is a cross-sectional view illustrating a chip stack package in accordance with example embodiments of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deplugtions in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a chip stack package in accordance with example embodiments of the present invention.

Referring to FIG. 1, a chip stack package 100 includes a plurality of chips 110, a plurality of adhesive layers 120, a substrate 130, a plug 140, a sealing layer 150 and a solder ball 160.

The substrate 130 includes a wiring pattern 132 thereon and a seed layer 134 formed on the wiring pattern 132. The seed layer 134 has a predetermined size. For example, the substrate 130 may be a printed circuit board (PCB), a silicon substrate, etc.

Figure 2A:
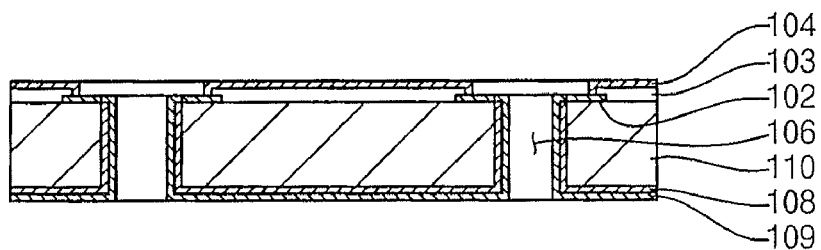
FIGS. 2A to 2E are cross-sectional views illustrating a method of manufacturing the chip stack package in FIG. 1 in accordance with example embodiments of the present invention.

Each of the chips 110 includes an electrode pad 102, a first insulation layer 103, a first diffusion barrier layer 104, a first through-hole 106, a second insulation layer 108 and a second diffusion barrier layer 109, as illustrated in FIG. 2A. The electrode pad 102 is provided on a first surface of the chip 110. For example, the chip 110 may include a wiring on the first surface in order to align the electrode pad 102 and/or improve the electric power distribution on the chip 110. The wiring may connect a circuit pattern of the chip 110 to the electrode pad 102. The first insulation layer 103 is provided on the first surface of the chip 110 so as to expose the electrode pad 102. The first diffusion barrier layer 104 is provided on the first surface of the chip 110 so as to cover the first insulation layer 103. The first through-hole 106 penetrates the chip 110 across the electrode pad 102. The size of the first through-hole 106 may be smaller than that of the electrode pad 102. The second insulation layer 108 is provided on a second surface opposite to the first surface of the chip 110 and on an inner surface of the first through-hole 106. The second diffusion barrier layer 109 covers the second insulation layer 108.

The first insulation layer 103 and the second insulation layer 108 may include dielectric polymer, oxide, nitride, etc. Examples of the dielectric polymer may include imide, epoxy, novolac, benzocyclobutene (BCB), polybenzoxazole (PBO), etc. Examples of the oxide may include silicon oxide. Examples of the nitride may include silicon nitride. The first diffusion barrier layer 104 and the second diffusion barrier layer 109 may include metal nitride. Examples of the metal nitride may be titanium aluminum nitride, aluminum nitride, titanium nitride, titanium silicon nitride, tantalum nitride, tantalum silicon nitride, tungsten nitride, etc.

The chips 110 are stacked on the substrate 130 such that the first through-holes 106 are aligned. Since the chips 110 have substantially flat, even surfaces and the inside of the first through-holes 106 is empty, the first through-holes 106 may align easily with one another. The aligned first through-holes 106 are arranged on the seed layer 132.

In one example embodiment, the chips 110 are stacked such that the electrode pads 102 face upward. In another example embodiment, the chips 110 are stacked such that the electrode pads 102 face downward. In another example embodiment, the chips 110 are stacked such that some electrode pads 102 face upward and other electrode pads 102 face downward.

The adhesive layers 120 are interposed between the substrate 130 and one of the chips 110, as well as between the chips 110 such that the chips 110 adhere to the substrate 130. Each of the adhesive layers 120 includes a second through-hole 122 that exposes the first through-hole 106. The size of the second through-hole 122 may be larger than that of the first through-hole 106. The second through-hole 122 exposes the electrode pad 102 of each of the chips 110.

The plug 140 fills up the first through-holes 106 and the second through-holes 122 so as to penetrate the chips 110. A cross-sectional area of a portion of the plug 140 in the second through-hole 122 is larger than a cross-sectional area of a portion of the plug 140 in the first through-hole 106 because the size of the second through-hole 122 is larger than that of the first through-hole 106. Accordingly, the plug 140 may make accurate contact with the exposed electrode pads 102. Further, a contact area between the plug 140 and each of the chips 110 is broadened so as to increase a physical adhesive force therebetween. The plug 140 is electrically connected to the seed layer 134 of the substrate 130. Thus, the electrode pads 102 of the chips 110 are electrically connected to the wiring pattern 132 of the substrate 130. The plug 140 may include conductive material. Examples of the conductive material may be nickel (Ni), copper (Cu), gold (Au), a solder, etc.

The plug 140 may be formed by a plating process using the seed layer 134. For example, the plating process may be performed using an electroplating process, an electroless plating process, etc. The plug 140 may be grown from the seed layer 134 in substantially a single direction. Accordingly, the void generation within the plug 140 may be avoided. Further, because the plug 140 penetrates the chips 110, although the first through-holes 106 have different sizes, the electrode pads 102 of the chips 110 may be electrically connected to one another.

The first diffusion barrier layer 104 and the second diffusion barrier layer 109 prevent conductive material included in the plug 140 from diffusing into the chip 110. Accordingly, the plug 140 may be electrically connected only to the electrode pad 102 and not connected to other portions of the chips 110.

The sealing layer 150 is provided on the substrate 130 to cover the chips 110. The sealing layer 150 protects the chips 110 and the plug 140 from external factors such as impacts. For example, the sealing layer 150 may include glop top, an epoxy molding compound (EMC), etc.

The solder ball 160 is mounted on a lower surface of the substrate 130. The solder ball 160 is connected to the wiring pattern 132. For example, the solder ball 160 may include lead (Pb), tin (Sn), nickel (Ni), an alloy thereof, etc.

FIGS. 2A to 2E are cross-sectional views illustrating a method of manufacturing the chip stack package in FIG. 1 in accordance with example embodiments of the present invention.

Referring to FIG. 2A, a plurality of chips 110 is provided. The chip 110 includes a first through-hole 106 that penetrates an electrode pad 102.

Figure 2B:
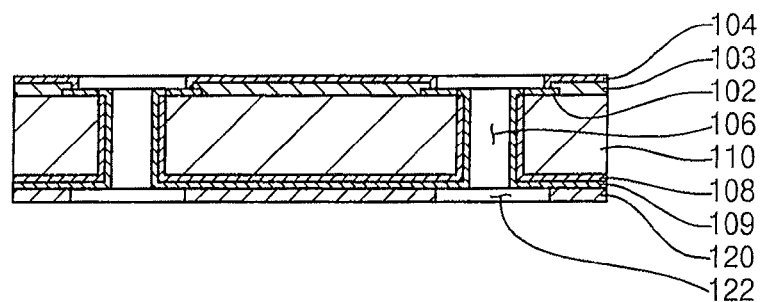

Referring to FIG. 2B, an adhesive layer 120 is formed on the chip 110. For example, the adhesive layer 120 may include photoresist or epoxy. Adhesive material may be coated on the chip 110 or an adhesive tape may be adhered to the chip 110 to form the adhesive layer 120. As illustrated in FIG. 2B, the adhesive layer 120 may be formed on a second surface of the chip 110. Alternatively, the adhesive layer 120 may be formed on a first surface opposite to the second surface of the chip 110.

The adhesive layer 120 may be partially removed to form a second through-hole 122 that exposes the first through-hole 106. The size of the second through-hole 122 may be larger than that of the first through-hole 106. When the adhesive layer 120 includes photoresist, the second through-hole 122 may be formed using an exposure and development process. When the adhesive layer 120 includes epoxy, the second through-hole 122 may be formed using an asking process.

Figure 2C:
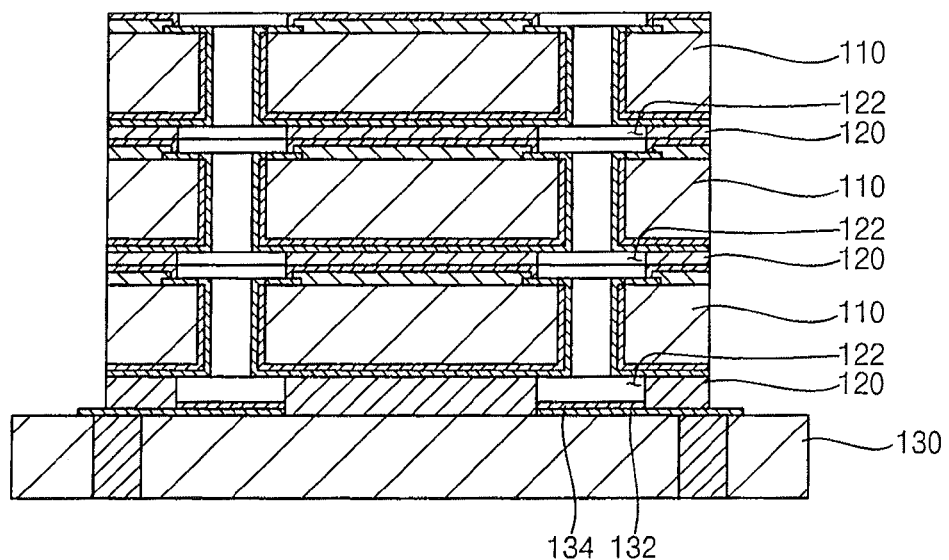

Referring to FIG. 2C, the chips 110 are stacked on the substrate 130 having the wiring pattern 132 and the seed layer 134 such that the adhesive layer 120 formed on the chip 110 faces downward. The first through-holes 106 of the chips 110 align so as to be connected to one another. The first through-holes 106 may be easily aligned because the chips have substantially flat, even surfaces. The first through-holes 106 are positioned on the seed layer 134.

Figure 2D:
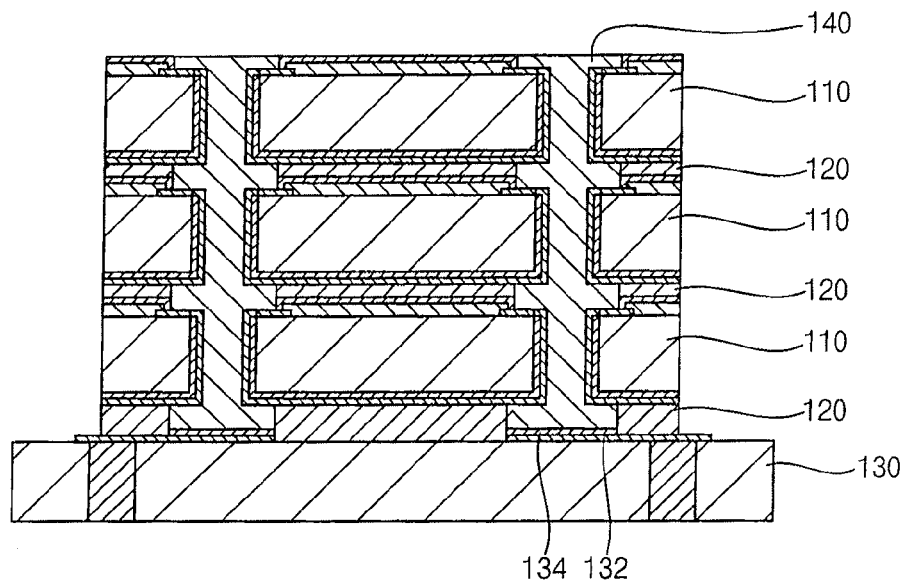

Referring to FIG. 2D, the first through-holes 106 and the second through-holes 122 are filled with conductive material by a plating process using the seed layer 135 as a seed to form a plug 140. For example, the plating process may be performed using an electroplating process, an electroless plating process, etc. The plug 140 may include conductive material. Examples of the conductive material may be nickel, copper, gold, solder, etc. The void generation within the plug 140 may be avoided because the plug 140 may be grown from the seed layer 134 in substantially a single direction along a direction in which the chips 110 are stacked. As the plug 140 is grown, the plug 140 may make electrical contact with the electrode pads 102 because the size of the second through-hole 122 is larger than that of the first through-hole 106. Further, the contact area between the plug 140 and the chip 110 is broadened to increase a physical adhesive force therebetween.

The first diffusion barrier layer 104 and the second diffusion barrier layer 109 prevent conductive material included in the plug 140 from diffusing into the chip 110. Accordingly, the plug 140 may be electrically connected only to the electrode pad 102 and not connected to other portions of the chips 110.

Figure 2E:
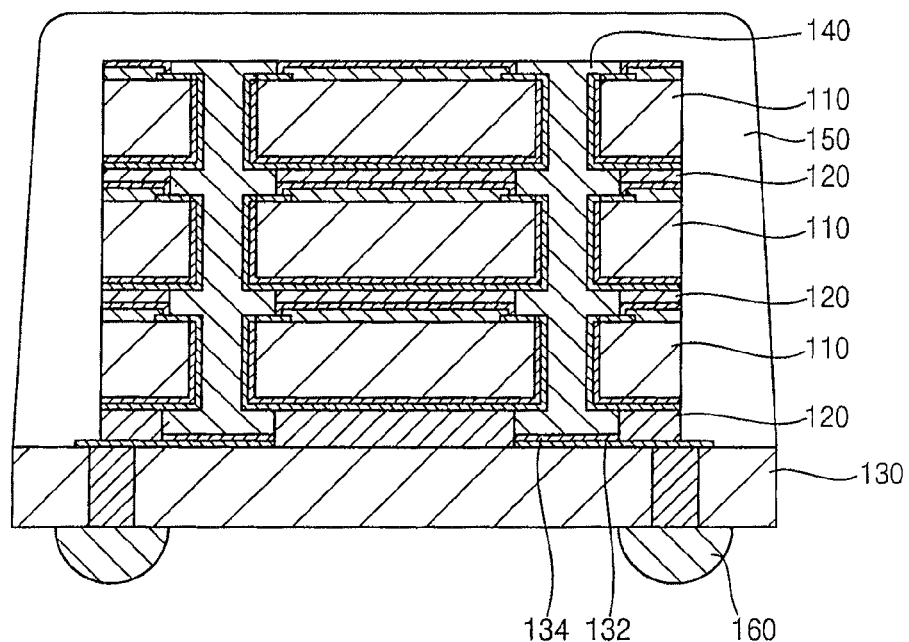

Referring to FIG. 2E, sealing material is coated on an upper surface of the substrate 130 to form a sealing layer 150 that covers the chips 110 and the plug 140. For example, the sealing layer 150 may include glop top, an EMC, etc.

A solder ball 160 is mounted on a lower surface of the substrate 130. The solder ball 160 is connected to the wiring pattern 132.

FIGS. 3A to 3E are cross-sectional views illustrating a method of manufacturing the chip in FIG. 2A in accordance with example embodiments of the present invention.

Figure 3A:
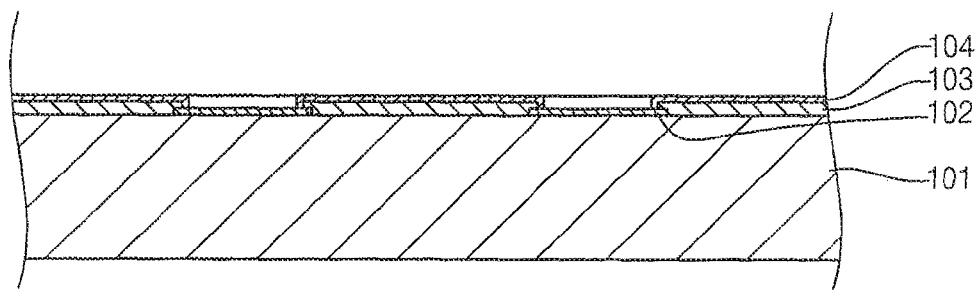
FIGS. 3A to 3E are cross-sectional views illustrating a method of manufacturing the chip in FIG. 2A in accordance with example embodiments of the present invention.

Referring to FIG. 3A, if desired, a wiring (not illustrated) can be formed on the wafer 101 to connect the electrode pads 102 to a circuit pattern (not illustrated) on an upper surface of the wafer 101. Accordingly, alignment positions of the electrode pads 102 may be adjusted.

The first insulation layer 103 is formed on a first surface of the wafer 101 where the electrode pads 102 are formed such that the first insulation layer 103 exposes the electrode pads 102. The first insulation layer 103 may include dielectric polymer, oxide, nitride, etc. Examples of the dielectric polymer may include imide, epoxy, novolac, benzocyclobutene (BCB), polybenzoxazole (PBO), etc. An example of the oxide may be silicon oxide. An example of the nitride may be silicon nitride. The first insulation layer 103 may be formed by a chemical vapor deposition (CVD) process, an atomic layer deposition (ALD) process, a chemical oxidation treatment process, a spray-coating process, a spin-coating process, a dip-coating process, etc.

The first diffusion barrier layer 104 is formed on the first surface to cover the first insulation layer 103 and expose the electrode pad 102. The first diffusion barrier layer 104 may include metal nitride. Examples of the metal nitride may be titanium aluminum nitride, aluminum nitride, titanium nitride, titanium silicon nitride, tantalum nitride, tantalum silicon nitride, tungsten nitride, etc. The first diffusion barrier layer 104 may be formed by a CVD process, an ALD process, a sputtering process, etc.

Figure 3B:
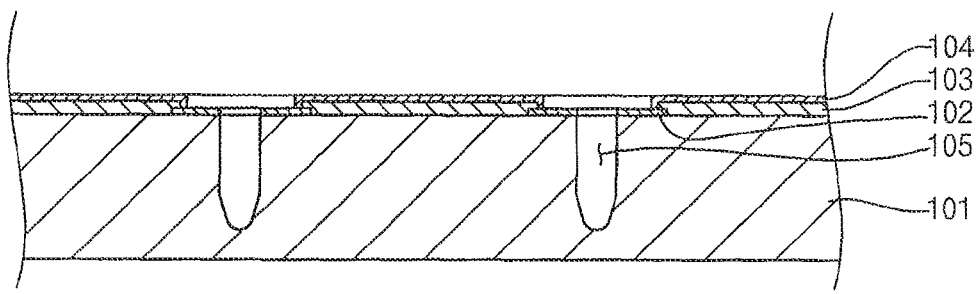

Referring to FIG. 3B, a recess 105 is formed on the first surface to penetrate the electrode pad 102. The recess 105 may be formed by a dry-etch process, a laser-etch process, etc. The size of the recess 105 may be smaller than that of the electrode exposed by the first insulation layer 103 and the first diffusion barrier layer 104.

Figure 3C:
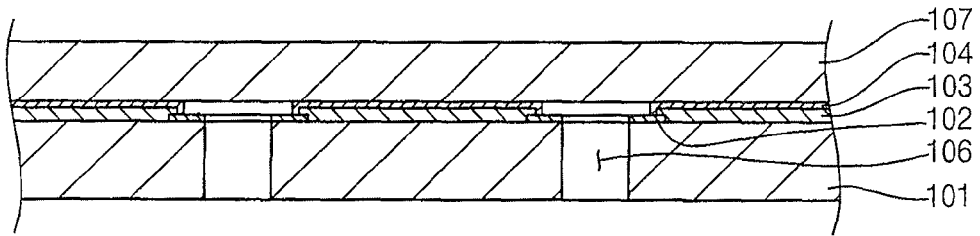

Referring to FIG. 3C, a fixing plate 107 is adhered to the first surface of the wafer 101. A second surface opposite to the first surface of the wafer 101 is planarized until the recess 105 is exposed to form the first through-hole 106. For example, the second surface of the wafer 101 may be planarized by a grinding process, a chemical mechanical polishing (CMP) process, etc.

Figure 3D:
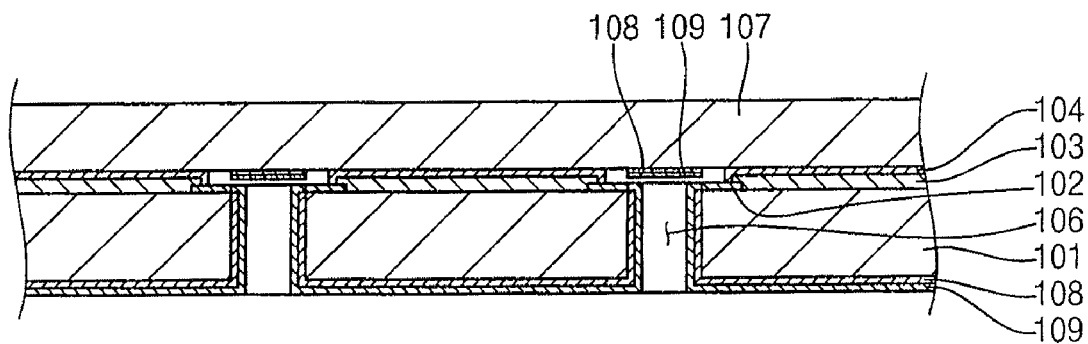

Referring to FIG. 3D, the second insulation layer 108 is formed on the second surface of the wafer 101 and on an inner surface of the first through-hole 106. The second insulation layer 108 may be formed by a process that is substantially the same as or similar to the process for forming the first insulation layer 103. The second insulation layer 108 may be formed using material that is substantially the same as or similar to the material for the first insulation layer 103.

The second diffusion barrier layer 109 is formed on the second surface of the wafer 101 to cover the second insulation layer 108. The second diffusion barrier layer 109 may be formed by a process that is substantially the same as or similar to the process for forming the first diffusion barrier layer 104. The second diffusion barrier layer 109 may be formed using material that is substantially the same as or similar to the material for the first diffusion barrier layer 104.

Figure 3E:
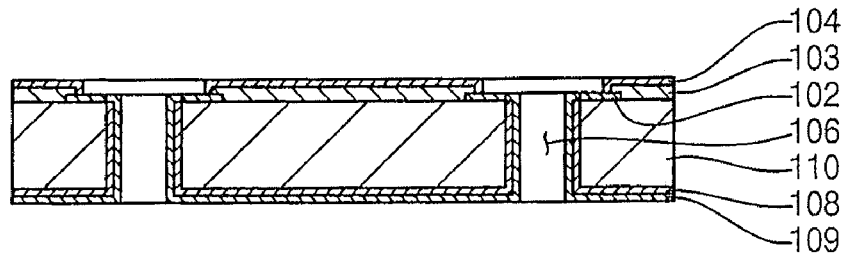

Referring to FIG. 3E, the wafer 101 is cut and the fixing plate 107 is removed from the wafer 101 to form the chip 110.

Figure 4:
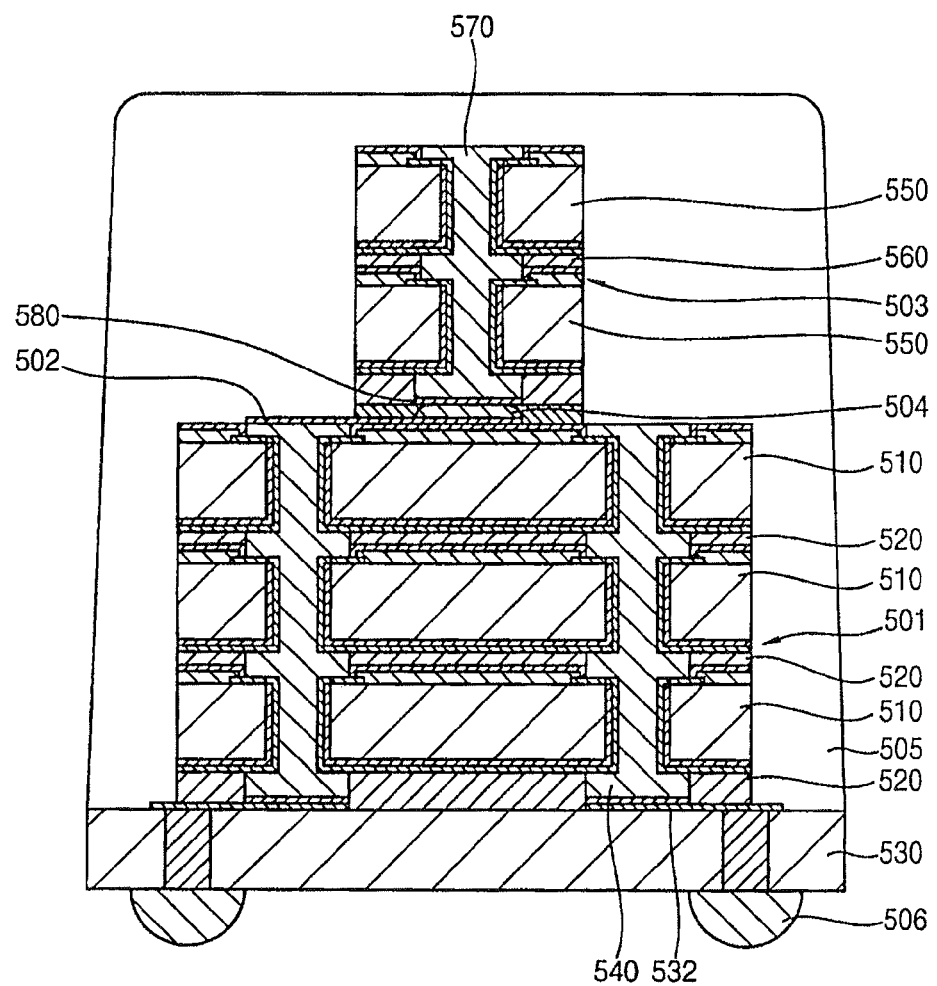
FIG. 4 is a cross-sectional view illustrating a chip stack package in accordance with another example embodiment of the present invention.

FIG. 4 is a cross-sectional view illustrating a chip stack package in accordance with another example embodiment of the present invention.

Referring to FIG. 4, a chip stack package 500 includes a first chip structure 501, a redistribution layer 502, a solder bump 504, a sealing layer 505 and a solder ball 506.

The first chip structure 501 includes first chips 510, first adhesive layers 520, a substrate 530 and a first plug 540. The first chips 510, the first adhesive layers 520, the substrate 530 and the first plug 540 may be substantially the same as or similar to the chips 110, the adhesive layer 120, the substrate 130 and the plug 140, respectively, that are described with reference to FIG. 1, and thus detailed descriptions thereof will be omitted here.

The redistribution layer 502 is provided on an uppermost chip 510 of the first chip structure 501. The redistribution layer 502 includes a redistribution pad (not illustrated) connected to the first plug 540.

The second chip structure 503 includes second chips 550, second adhesive layers 560, a second plug 570 and a second seed layer 580. The second chips 550, the second adhesive layers 560 and the second plug 570 may be substantially the same as the first chips 510, the first adhesive layers 520 and the first plug 540, respectively, except that the sizes of the second chips 550 are different from that of the first chips 510 and the second plug 570 is spaced apart from the first plug 540, and thus, detailed descriptions thereof will be omitted here. The second seed layer 580 is provided on an upper surface or a lower surface of the second plug 570.

The solder bump 504 electrically connects the redistribution layer 502 to the second plug 570 of the second chip structure 503. The solder bump 504 may be connected to an end portion of the second plug 570 including the second seed layer 580.

The sealing layer 505 is provided on the substrate 530 to cover the first chips 510 of the first chip structure 501, the redistribution layer 502 and the second chip structure 503. The sealing layer 505 protects the first chip structure 501, the redistribution layer 502 and the second chip structure 503 from external factors such as impacts. For example, the sealing layer 505 may include glop top, an EMC, etc.

The solder ball 506 is mounted on a lower surface of the substrate 530. The solder ball 506 is electrically connected to a wiring pattern 532. For example, the solder ball 506 may include lead (Pb), tin (Sn), nickel (Ni), etc. These may be used alone or in a mixture thereof.

According to the chip stack package illustrated in FIG. 4, even when the chips 510 and 550 may be different in one or more of size, shape, and function, the chip structures may include the plugs 540 and 570 that are spaced apart from one another; and the redistribution layer 502 can connect the chip structures to one another. Consequently, even though the chips 510 and 550 are different, the chip structures can still be electrically connected through the plugs 540 and 570 and the redistribution layer 502.

FIGS. 5A to 5D are cross-sectional views illustrating a method of manufacturing the chip stack package in FIG. 4 in accordance with another example embodiment of the present invention.

Figure 5A:
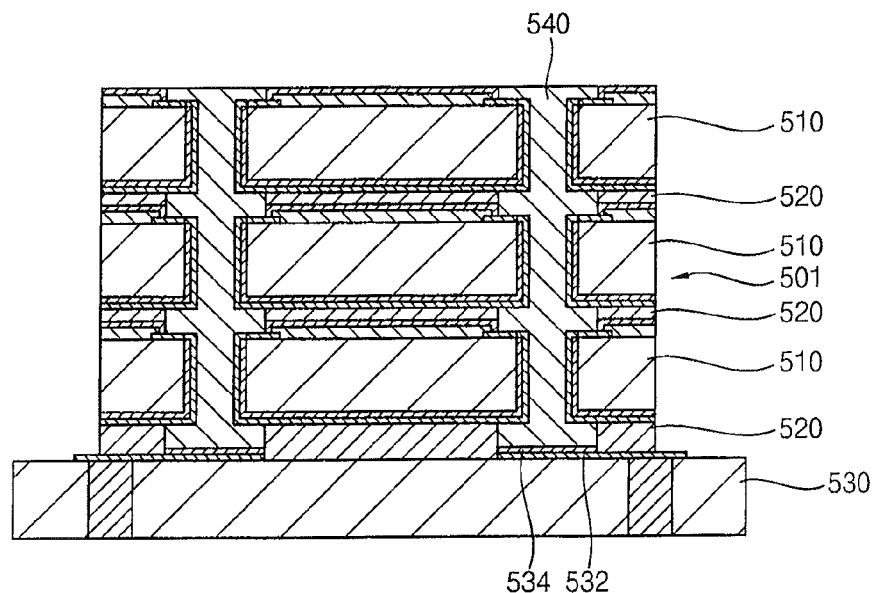
FIGS. 5A to 5D are cross-sectional views illustrating a method of manufacturing the chip stack package in FIG. 4 in accordance with another example embodiment of the present invention.

Referring to FIG. 5A, the first chips 510 are adhered to the substrate 530 to form the first chip structure 501 including the first chips 510, the first adhesive layers 520, the substrate 530 and the first plug 540.

A method of manufacturing the first structure 501 is substantially the same as the method of manufacturing the chip stack package as illustrated in FIGS. 2A to 2D.

Figure 5B:
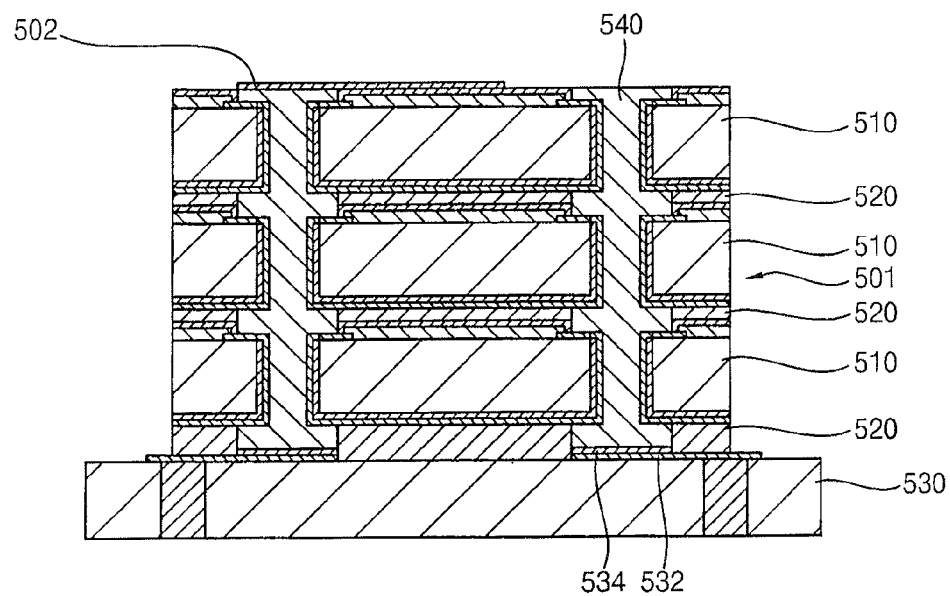

Referring to FIG. 5B, the redistribution layer 502 is formed on an uppermost layer of the first chip 510 of the first chip structure 501. The redistribution layer 502 is connected to the first plug 540.

Figure 5C:
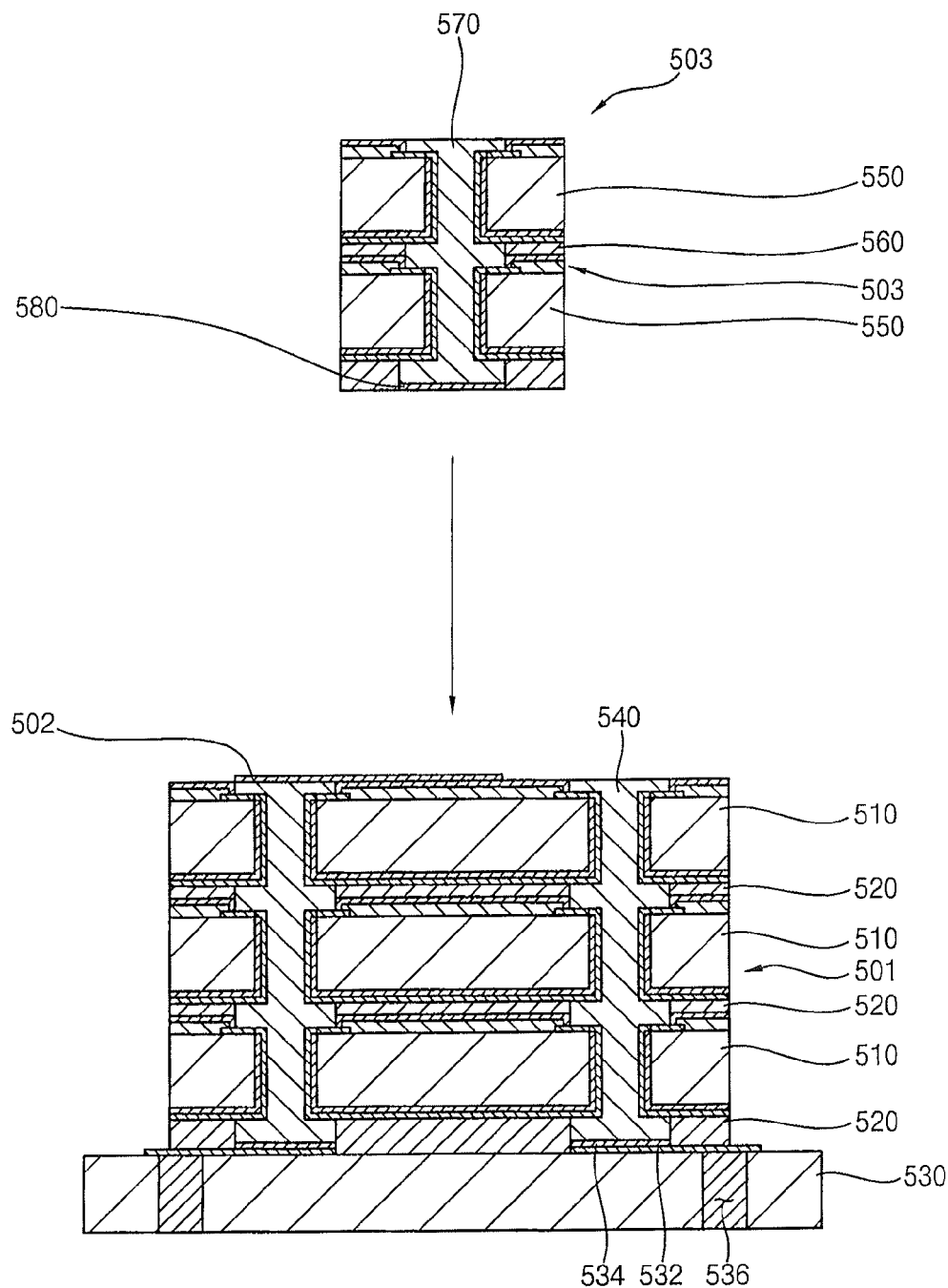

Referring to FIG. 5C, a second chip structure 503 is formed on the first chip structure 501. The second chip structure 503 includes the second chips 550, the second adhesive layers 560, the second plug 570 and the second seed layer 580. The size of the second chips 550 of the second chip structure 503 may be different from that of the first chips 510 of the first chip structure 501. The second plug 570 of the second chip structure 503 may be spaced apart from the first plug 540 of the first chip structure 501.

Figure 5D:
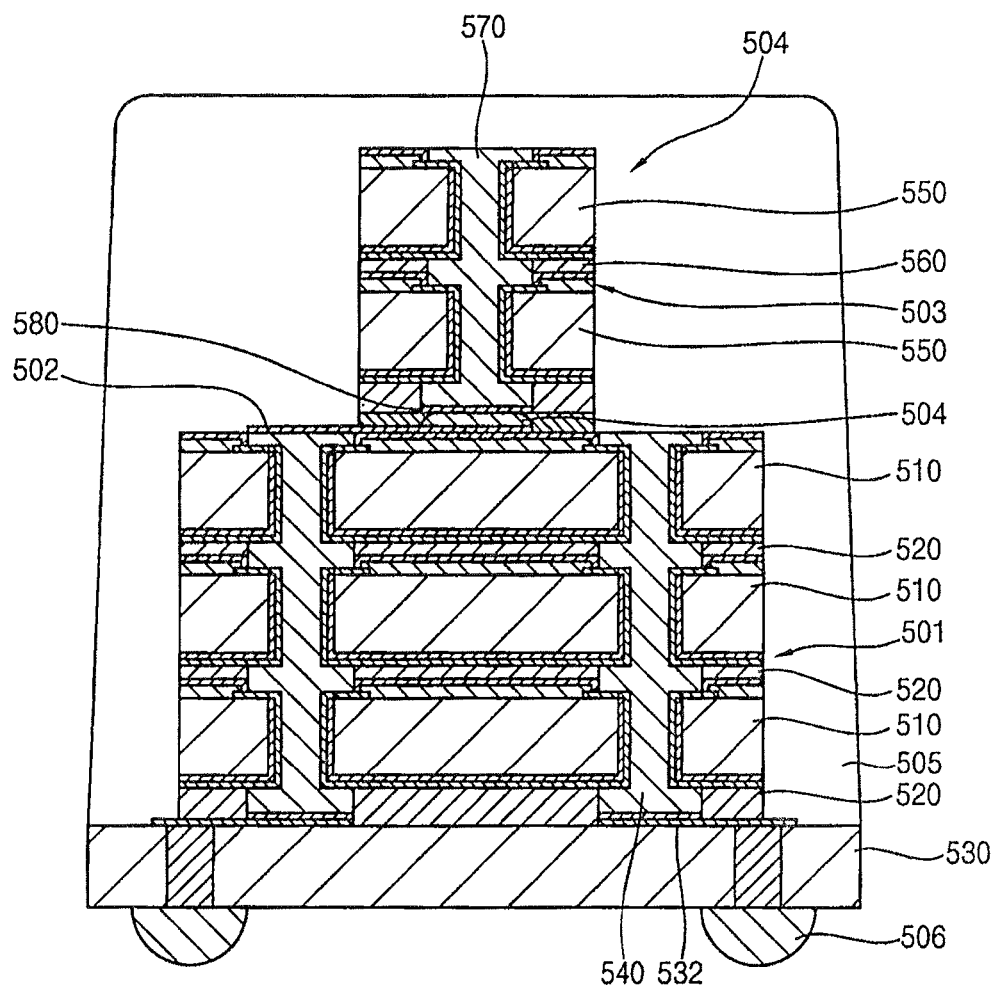

Referring to FIG. 5D, after a solder bump 504 is formed on a redistribution pad of the redistribution layer 502, the second plug 570 of the second chip structure 503 makes contact with the solder bump 504. The solder bump 504 is connected to the redistribution layer 502 and the second plug 570 by a reflow process. The solder bump 504 may be connected to the second plug 570 including the second seed layer 580.

Sealing material is coated on the substrate 530 to form a sealing layer 505 that covers the first chips 510 of the first chip structure 501, the redistribution layer 502 and the second chip structure 503.

The solder ball 506 is mounted on a lower surface of the substrate 530. The solder ball 506 is electrically connected to a wiring pattern 532.

Figure 6A:
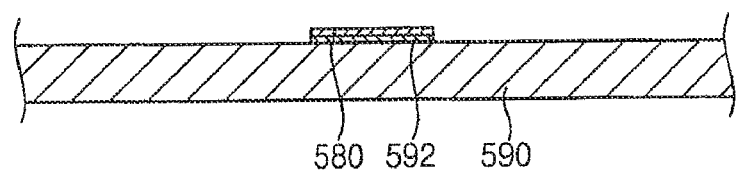
FIGS. 6A to 6C are cross-sectional views illustrating a method of manufacturing the second chip structure in FIG. 5C.
Figure 6B:
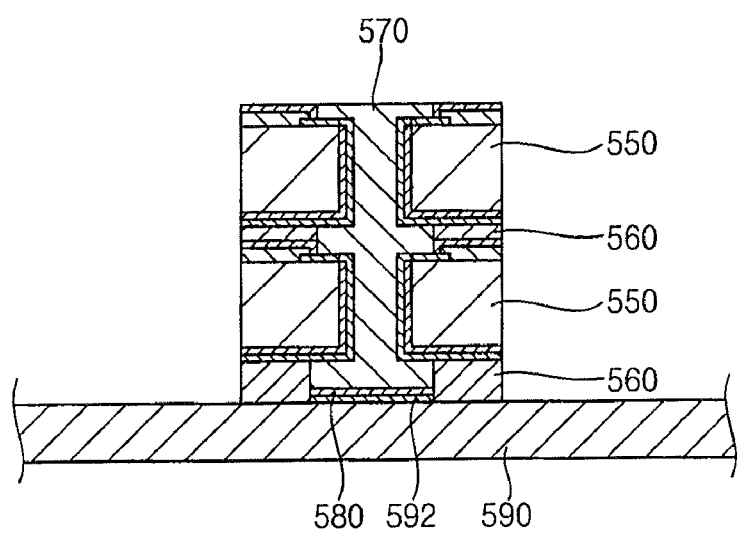
Figure 6C:
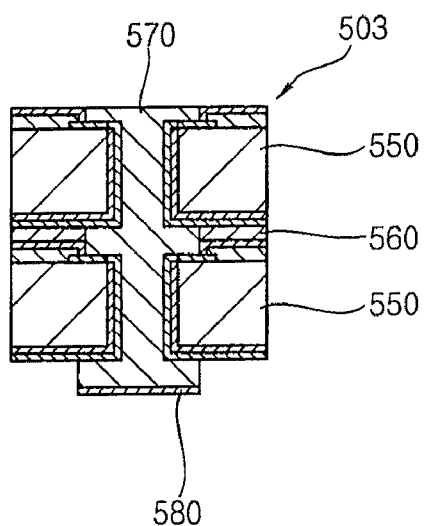

FIGS. 6A to 6C are cross-sectional views illustrating a method of manufacturing the second chip structure in FIG. 5C.

Referring to FIG. 6A, a first metal layer 592 having a first ionization tendency is formed on a sacrificial substrate 590.

The first metal layer 592 may include tin silver (SnAg), tin (Sn), tin copper (SnCu), indium (In), etc. These may be used alone or in a mixture thereof.

A second metal layer 580 having a second ionization tendency smaller than the first ionization tendency is formed on the first metal layer 592. The second metal layer 580 may include silver (Ag), gold (Au), etc. These may be used alone or a mixture thereof. The first and the second metal layers may include any one selected from the group consisting of a combination of various metals having different ionization tendencies, respectively.

Referring to FIG. 6B, after second adhesive layers 560 are formed on second chips 550, the second chips 550 are stacked, and then, the second plug 570 is formed through the stacked chips 550. The method of forming the second plug 570 through the stacked chips 550 may be substantially the same as the method described with reference to FIGS. 2A to 2D.

Referring to FIG. 6C, the first metal layer 592 and the second metal layer 580 are exposed to an electrolyte solution. Examples of the electrolyte solution may be a sulfuric acid solution, a nitric acid solution, hydrogen peroxide solution, etc. The first metal layer 592 is dissolved at a greater rate than the second metal layer 580 in the electrolyte solution due to the difference of the ionization tendencies. Thus, the sacrificial substrate 590 can be separated from the second metal layer 580 to form the second chip structure 503 because the first metal layer 592 is selectively removed.

FIGS. 7A to 7D are cross-sectional views illustrating another method of manufacturing the second chip structure in FIG. 5C.

Figure 7A:
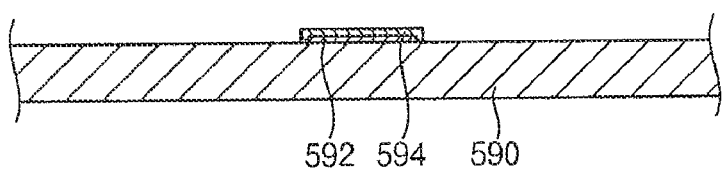
FIGS. 7A to 7D are cross-sectional views illustrating another method of manufacturing the second chip structure in FIG. 5C.

Referring to FIG. 7A, the first metal layer 592 is formed on the sacrificial layer 590. The first metal layer 592 may include nickel (Ni), chromium (Cr), gold (Au), etc. The first metal layer 592 is oxidized to form an oxidation layer 594. The oxidation layer 594 may be formed by a thermal oxidation process, a natural oxidation process, etc.

Figure 7B:
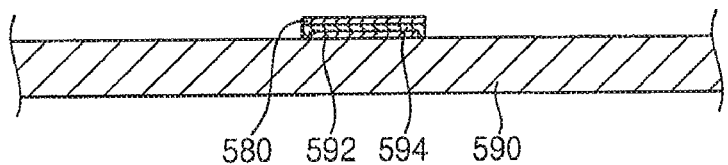

Referring to FIG. 7B, a second metal layer 580 is formed on the metal layer 592. The second metal layer 580 may include nickel (Ni), chromium (Cr), gold (Au), etc.

Figure 7C:
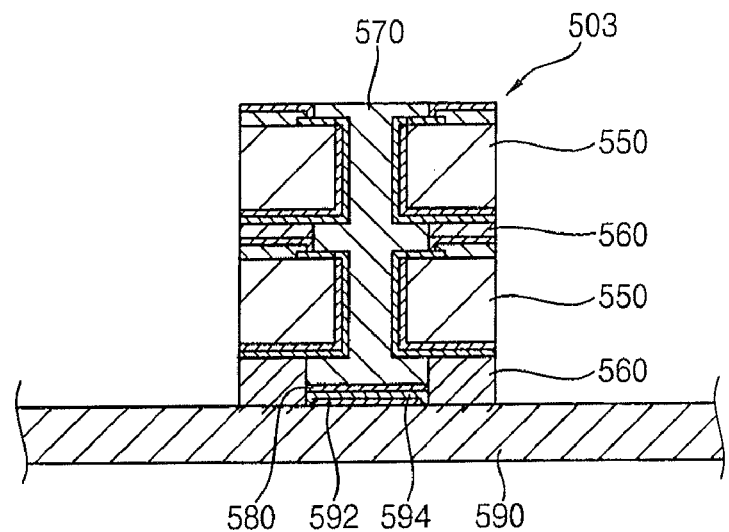

Referring to FIG. 7C, after second adhesive layers 560 are formed on second chips 550, the second chips 550 are stacked, and then, the second plug 570 is formed through the stacked chips 550. The method of forming the second plug 570 through the stacked chips 550 may be substantially the same as the method described with reference to FIGS. 2A to 2D.

Figure 7D:
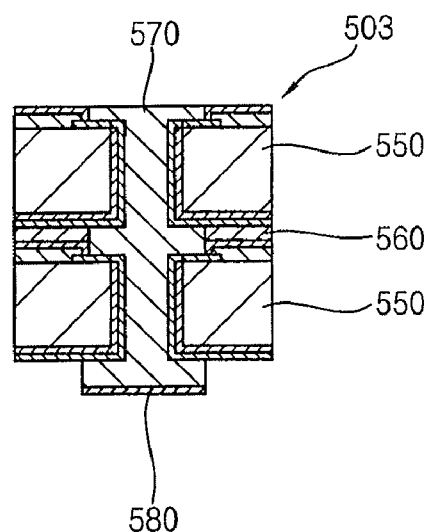

Referring to FIG. 7D, the oxidation layer 594 between the first metal layer 592 and the second metal layer 580 decreases an adhesive force between the first metal layer 592 and the second metal layer 580. Accordingly, since the first metal layer 592 may be easily separated from the second metal layer 580, the sacrificial substrate 590 is separated from the second metal layer 580 to form the second chip structure 503.

As mentioned above, according to example embodiments of the present invention, a plug penetrating stacked chips is formed by a plating process. Accordingly, the generation of a void within the plug can be avoided. Also, uniformity of the shape and dimensions of the plug may be improved. Further, a required time for forming the plug may be reduced and electrical properties of the chip stack package may be improved because the plug penetrating the stacked chips is formed by the plating process. Thus, even though electrode pads are spaced apart from one another and/or sizes and shapes of the chips are different from one another, the chip stack package may be easily manufactured by the methods described above.

According to one aspect of the present invention, a chip stack package includes a substrate, a plurality of chips, a plurality of adhesive layers and a plug. The substrate has a wiring pattern and a seed layer formed on the wiring pattern. Each of the chips has an electrode pad and a first through-hole that penetrates the electrode pad. The chips are stacked such that the first through-holes are aligned on the seed layer of the substrate. A plurality of the adhesive layers is interposed between the substrate and one of the chips, as well as between the chips. Each of the adhesive layers has a second through-hole connected to the first through-hole. The plug fills up the first through-holes and the second through-holes and electrically connects the electrode pads of the chips to the wiring pattern of the substrate.

In one example embodiment, a cross-sectional area of the plug in the second through-hole may be larger than a cross-sectional area of the plug in the first through-hole.

In another example embodiment, each of the chips may include an insulation layer that exposes the electrode pad on a surface of the chip. Each of the chips may further include a diffusion barrier layer on the insulation layer.

In another example embodiment, the chips may be stacked such that the electrode pads face upward.

In still another example embodiment, the chips may be stacked such that the electrode pads face downward.

In yet another example embodiment, some of the chips may be stacked such that the electrode pads face upward and others of the chips may be stacked such that the electrode pads face downward.

According to another aspect of the present invention, there is provided a method of manufacturing a chip stack package. In the method of manufacturing a chip stack package, a plurality of chips, each of the chips having an electrode pad and a first through-hole that penetrates the electrode pad, is prepared. Adhesive layers are formed on the chips. Each of the adhesive layers has a second through-hole that exposes the first through-hole. The chips having the adhesive layers are stacked such that the first through-holes are aligned on a seed layer of a substrate. The substrate has a wiring pattern and the seed layer on the wiring pattern. The first through-holes and the second through-holes are filled up with a conductive material by a plating process to form a plug that electrically connects the chips to one another.

In one example embodiment, a cross-sectional area of the plug in the second through-hole may be larger than a cross-sectional area of the plug in the first through-hole.

In another example embodiment, the chips may be stacked such that the electrode pads face upward.

In still another example embodiment, the chips may be stacked such that the electrode pads face downward.

In yet another example embodiment, some of the chips may be stacked such that the electrode pads face upward and others of the chips are stacked such that the electrode pads face downward.

In still another example embodiment, the conductive material may be grown in a stacked direction of the chips from the seed layer to form the plug.

In another example embodiment, preparing the chips may include forming a first insulation layer on an upper surface of the wafer having a circuit pattern formed thereon, the first insulation layer exposing the electrode pad; forming a recess that penetrates the electrode pad on the upper surface of the wafer; planarizing a lower surface of the wafer until the recess is exposed to form the first through-hole that penetrates the wafer; forming a second insulation layer on an inner surface of the first through-hole and the lower surface of the wafer; and cutting the wafer to form the chips.

The size of the first through-hole may be smaller than that of the electrode pad exposed by the first insulation layer.

Preparing the chips may further include forming a wiring that connects the electrode pad to the circuit pattern of the chip to adjust alignment positions of the electrode pads of the chips.

Preparing the chips may further include forming a diffusion barrier layer on the second insulation layer.

According to still another aspect of the present invention, a chip stack package includes a first chip structure, a redistribution layer and a second chip structure.

The first chip structure includes a substrate having a wiring pattern and a seed layer formed on the wiring pattern; a plurality of first chips having a first electrode pad and a first through-hole that penetrates the first electrode pad, respectively, the first chips being stacked such that the first through-holes are aligned on the seed layer of the substrate; a plurality of first adhesive layers interposed between the substrate and the first chip, as well as between the first chips, the first adhesive layer having a second through-hole that exposes the first through-hole; and a first plug filling up the first through-holes and the second through-holes and electrically connecting the first electrode pads of the first chips to the wiring pattern of the substrate.

The redistribution layer is formed on an uppermost chip of the first chip structure and connected to the first plug.

The second chip structure includes a plurality of second chips having a second electrode pad and a third through-hole that penetrates the second electrode pad, respectively, the second chips being stacked such that the third through-holes are aligned on the redistribution layer; a plurality of second adhesive layers interposed between the second chips, each of the second adhesive layers having a fourth through-hole that exposes the third through-hole; and a second plug filling up the third through-holes and the fourth through-holes and electrically connecting the second electrode pads of the second chips to the redistribution layer.

In one example embodiment, a cross-sectional area of the first plug in the second through-hole may be larger than a cross-sectional area of the first plug in the first through-hole, and a cross-sectional area of the second plug in the fourth through-hole may be larger than a cross-sectional area of the second plug in the third through-hole.

In another embodiment, the chip stack package may further include a conductive bump connecting the redistribution layer to the second plug.

According to still another aspect of the present invention, there is provided a method of manufacturing a chip stack package. In the method of manufacturing a chip stack package, a first chip structure is formed. The first chip structure includes a substrate having a wiring pattern and a seed layer formed on the wiring pattern; a plurality of first chips having a first electrode pad and a first through-hole that penetrates the first electrode pad, respectively, the first chips being stacked such that the first through-holes are aligned on the seed layer of the substrate; a plurality of first adhesive layers interposed between the substrate and the first chip, as well as between the first chips, each of the first adhesive layers having a second through-hole that exposes the first through-hole; and a first plug filling up the first through-holes and the second through-holes and electrically connecting the first electrode pads of the first chips to the wiring pattern of the substrate. A redistribution layer is formed on an uppermost or lowermost chip of the first chip structure. The redistribution layer is connected to the first plug. A second chip structure is formed. The second chip structure includes a plurality of second chips having a second electrode pad and a third through-hole that penetrates the second electrode pad, respectively, the second chips being stacked such that the third through-holes are aligned on the redistribution layer; a plurality of second adhesive layers interposed between the second chips, each of the second adhesive layers having a fourth through-hole that exposes the third through-hole; and a second plug filling up the third through-holes and the fourth through-holes and electrically connecting the second electrode pads of the second chips to one another. The second chip structure is adhered on the redistribution layer to connect the redistribution layer to the second plug.

In one example embodiment, to form the second chip structure, a first metal layer having a first ionization tendency may be formed on a sacrificial substrate. A second metal layer having a second ionization tendency smaller than the first ionization tendency may be formed on the first metal layer. The second chips having the third through-hole that penetrates the second electrode pad may be prepared. The second adhesive layers may be formed on the second chips, respectively. The second adhesive layers may have the fourth through-hole that exposes the third through-hole. The second chips including the second adhesive layers formed thereon may be stacked such that the third through-holes are aligned on the second metal layer. The third through-holes and the fourth through-holes may be filled up with conductive material by a plating process using the second metal layer as a seed to form the second plug. The first metal layer may be selectively removed using a difference of the ionization tendencies of the first metal layer and the second metal layer.

The first metal layer may include tin silver (SnAg), tin (Sn), tin copper (SnCu) or indium (In), the second metal layer may include silver (Ag) or gold (Au), and an electrolyte solution for selectively removing the first metal layer may include a sulfuric acid solution, a nitric acid solution or a hydrogen peroxide solution. The first and the second metal layers may include a combination of various metals having different ionization tendencies.

In another example embodiment, to form the second chip structure, a first metal layer may be formed on a sacrificial substrate. The first metal layer is oxidized. A second metal layer may be formed on the oxidized first metal layer. The second chips having the third through-hole that penetrates the second electrode pad may be prepared. The second adhesive layers may be formed on the second chips, respectively. Each of the second adhesive layers may have the fourth through-hole that exposes the third through-hole. The second chips including the second adhesive layers formed thereon may be stacked such that the third through-holes are aligned on the second metal layer. The third through-holes and the fourth through-holes may be filled up with conductive material by a plating process using the second metal layer as a seed to form the second plug. The oxidized first metal layer may be separated from the second metal layer.

The first and second metal layers may include nickel (Ni), chromium (Cr) or gold (Au).

According to the present invention, a plug penetrating stacked chips is formed by a plating process in a stacked direction of the chips. Accordingly, formation of a void in the plug may be avoided. Uniformity of the shape and dimensions of the plug may be improved. Further, a required time for forming the plug may be reduced.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of manufacturing a chip stack package comprising:
preparing a plurality of chips having an electrode pad and a first through-hole that penetrates the electrode pad;
forming adhesive layers on the chips, wherein each of the adhesive layers includes a second through-hole that exposes the first through-hole;
stacking the chips having the adhesive layers such that the first through-holes are aligned on a seed layer of a substrate, the substrate having a wiring pattern and the seed layer disposed on the wiring pattern; and
after stacking the chips, filling the first through-holes and the second through-holes with conductive material using a single plating step so as to form a plug that electrically connects the chips to one another.

2. The method of claim 1, wherein a cross-sectional area of a portion of the plug in the second through-holes is larger than a cross-sectional area of a portion of the plug in the first through-holes.

3. The method of claim 1, wherein the chips are stacked such that the electrode pads face upward.

4. The method of claim 1, wherein the chips are stacked such that the electrode pads face downward.

5. The method of claim 1, wherein at least one of the chips is stacked such that the electrode pads face upward and at least one of the chips is stacked such that the electrode pads face downward.

6. The method of claim 1, wherein filling the first through-holes comprises growing the conductive material from the seed layer in a direction substantially parallel to a direction of stacking of the chips to form the plug.

7. The method of claim 1, wherein preparing the chips comprises:
forming a first insulation layer on an upper surface of a wafer having a circuit pattern formed thereon, the first insulation layer exposing at least a portion of the electrode pad;
forming a recess that penetrates the electrode pad at the upper surface of the wafer;
planarizing a lower surface of the wafer until the recess is exposed to form the first through-hole that penetrates the wafer;
forming a second insulation layer on an inner surface of the first through-hole and the lower surface of the wafer; and
cutting the wafer to form the chips.

8. The method of claim 7, wherein a diameter of the first through-hole is smaller than a diameter of the portion of the electrode pad exposed by the first insulation layer.

9. The method of claim 7, further comprising forming a wiring that connects the electrode pad to the circuit pattern of each of the chips so as to adjust alignment positions of the electrode pads of the chips.

10. The method of claim 7, further comprising forming a diffusion barrier layer on the second insulation layer.

11. A method of manufacturing a chip stack package comprising:
forming a first chip structure, the first chip structure including:
a substrate having a wiring pattern and a seed layer formed on the wiring pattern;
a plurality of first chips having a first electrode pad and a first through-hole that penetrates the first electrode pad, wherein the first chips are stacked such that the first through-holes are aligned on the seed layer of the substrate;
a plurality of first adhesive layers interposed between the substrate and the first chips and between the first chips, each of the first adhesive layers having a second through-hole that exposes the first through-hole; and
a first plug disposed in the first through-holes and the second through-holes and electrically connecting the first electrode pads of the first chips to the wiring pattern of the substrate wherein the first plug is formed to electrically connect the first chips to one another by filling the first through-holes and the second through-holes with conductive material using a single plating process step after stacking the first chips;
forming a redistribution layer on an uppermost chip of the first chip structure, the redistribution layer connected to the first plug;
forming a second chip structure, the second chip structure including:
a plurality of second chips having a second electrode pad and a third through-hole that penetrates the second electrode pad, wherein the second chips are stacked such that the third through-holes are aligned on the redistribution layer;
a plurality of second adhesive layers interposed between the second chips, each of the second adhesive layers having a fourth through-hole that exposes the third through-hole; and
a second plug disposed in the third through-holes and the fourth through-holes and electrically connecting the second electrode pads of the second chips to one another; and
adhering the second chip structure on the redistribution layer so as to connect the redistribution layer to the second plug.

12. The method of claim 11, wherein forming the second chip structure comprises:
forming a first metal layer having a first ionization tendency on a sacrificial substrate;
forming a second metal layer having a second ionization tendency smaller than the first ionization tendency on the first metal layer;
preparing the second chips having the third through-hole that penetrates the second electrode pad;
forming the second adhesive layers on the second chips, respectively, the second adhesive layers having the fourth through-hole that exposes the third through-hole;
stacking the second chips including the second adhesive layers formed thereon such that the third through-holes are aligned on the second metal layer;
filling up the third through-holes and the fourth through-holes with conductive material by a plating process using the second metal layer as a seed to form the second plug; and selectively removing the first metal layer using a difference of the ionization tendencies of the first metal layer and the second metal layer.

13. The method of claim 12, wherein the first metal layer comprises tin silver (SnAg), tin (Sn), tin copper (SnCu) or indium (In), the second metal layer comprises silver (Ag) or gold (Au), and an electrolyte solution for selectively removing the first metal layer comprises a sulfuric acid solution, a nitric acid solution or a hydrogen peroxide solution.

14. The method of claim 11, wherein forming the second chip structure comprises:
  forming a first metal layer on a sacrificial substrate;
  oxidizing at least a portion of the first metal layer;
  forming a second metal layer on the oxidized first metal layer;
  preparing the second chips having the third through-holes that penetrate the second electrode pads;
  forming the second adhesive layers on the second chips, respectively, each of the second adhesive layers having the fourth through-hole that exposes the third through-hole;
  stacking the second chips including the second adhesive layers formed thereon such that the third through-holes are aligned on the second metal layer;
  filling up the third through-holes and the fourth through-holes with conductive material by a plating process using the second metal layer as a seed to form the second plug; and
  separating the oxidized first metal layer from the second metal layer.

15. The method of claim 14, wherein the first and second metal layers comprise nickel (Ni), chromium (Cr) or gold (Au).

* * * * *